(12) United States Patent
Sugiyama et al.

(10) Patent No.: US 10,910,857 B2
(45) Date of Patent: Feb. 2, 2021

(54) SECONDARY BATTERY SYSTEM CONTROLLING A SECONDARY BATTERY WITH A VOLUME CHANGE RATE THEREOF, AND A VEHICLE INCLUDING THE SECONDARY BATTERY SYSTEM

(71) Applicant: Kabushiki Kaisha Toshiba, Tokyo (JP)

(72) Inventors: Nobukatsu Sugiyama, Kanagawa (JP); Ena Ishii, Kanagawa (JP); Tomokazu Morita, Chiba (JP); Yumi Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 15/904,257

(22) Filed: Feb. 23, 2018

(65) Prior Publication Data

US 2019/0067953 A1 Feb. 28, 2019

(30) Foreign Application Priority Data

Apr. 25, 2017 (JP) ................................. 2017-086462

(51) Int. Cl.
*H01M 10/44* (2006.01)
*H02J 7/00* (2006.01)
(Continued)

(52) U.S. Cl.
CPC ............ *H02J 7/007* (2013.01); *B60L 3/0046* (2013.01); *H01M 10/0525* (2013.01);
(Continued)

(58) Field of Classification Search
CPC .. H02J 7/007; H01M 10/446; H01M 10/0525; H01M 10/48; H01M 10/44; B60L 3/0046
(Continued)

(56) References Cited

U.S. PATENT DOCUMENTS 3,609,503 A * 9/1971 Burkett ................ H02J 7/00711
320/129
4,422,032 A * 12/1983 Kakumoto .............. H02J 7/022
320/139

(Continued)

FOREIGN PATENT DOCUMENTS

CN 102484294 A 5/2012
CN 110456275 A * 11/2019
(Continued)

OTHER PUBLICATIONS

Partial European Search Report and Provisional Opinion issued by the European Patent Office on May 4, 2018, for European Patent Application No. 18157152.2.

*Primary Examiner* — John T Trischler
(74) *Attorney, Agent, or Firm* — Finnegan, Henderson, Farabow, Garrett & Dunner, L.L.P.

(57) ABSTRACT

A secondary battery system includes a secondary battery, a measurement part, a designation part, and a controller. The measurement part measures a volume change rate of the secondary battery. The designation part designates a threshold value. The controller controls a current flowing through the secondary battery, based on the volume change rate of the secondary battery measured by the measurement part and the threshold value.

5 Claims, 8 Drawing Sheets

(51) Int. Cl.
*H01M 10/48* (2006.01)
*H01M 10/0525* (2010.01)
*B60L 3/00* (2019.01)
*H01M 4/587* (2010.01)
*H01M 4/02* (2006.01)

(52) U.S. Cl.
CPC ......... *H01M 10/44* (2013.01); *H01M 10/446* (2013.01); *H01M 10/48* (2013.01); *H01M 4/587* (2013.01); *H01M 10/445* (2013.01); *H01M 10/484* (2013.01); *H01M 2004/027* (2013.01); *H01M 2220/20* (2013.01); *H01M 2250/20* (2013.01); *Y02T 90/40* (2013.01)

(58) Field of Classification Search
USPC ................................................ 320/160, 162
See application file for complete search history.

(56) References Cited

U.S. PATENT DOCUMENTS

| | | | | |
|---|---|---|---|---|
| 4,689,544 A * | 8/1987 | Stadnick | H01M 10/345 | 320/147 |
| 5,093,624 A * | 3/1992 | Stevenson | H02J 7/0077 | 324/426 |
| 5,204,611 A * | 4/1993 | Nor | H02J 7/0086 | 320/145 |
| 5,394,075 A * | 2/1995 | Ahrens | B64G 1/428 | 136/246 |
| 5,680,030 A * | 10/1997 | Kadouchi | B60L 3/0046 | 320/134 |
| 6,074,775 A * | 6/2000 | Gartstein | H01M 2/12 | 429/53 |
| 6,118,248 A * | 9/2000 | Gartstein | H02J 2207/20 | 320/107 |
| 6,154,011 A * | 11/2000 | Lam | B60L 53/305 | 320/139 |
| 6,163,131 A * | 12/2000 | Gartstein | H02M 3/00 | 320/118 |
| 6,399,252 B1 * | 6/2002 | Kise | H01M 2/348 | 252/511 |
| 6,531,847 B1 * | 3/2003 | Tsukamoto | H01M 10/44 | 320/135 |
| 6,599,655 B2 * | 7/2003 | Johnson | B64G 1/425 | 320/116 |
| 6,773,633 B2 * | 8/2004 | Kise | H01M 2/348 | 252/511 |
| 6,878,481 B2 * | 4/2005 | Bushong | H01M 2/0421 | 429/175 |
| 6,928,381 B2 * | 8/2005 | Becker-Irvin | H02J 7/0091 | 320/150 |
| 7,288,920 B2 * | 10/2007 | Bushong | H01M 2/0421 | 320/147 |
| 7,528,571 B2 * | 5/2009 | Kernahan | H01M 10/44 | 320/107 |
| 7,592,776 B2 * | 9/2009 | Tsukamoto | H01M 10/44 | 320/136 |
| 7,830,125 B2 * | 11/2010 | Ibrahim | H02J 7/0029 | 320/134 |
| 7,843,169 B1 * | 11/2010 | Tsukamoto | H01M 2/34 | 320/117 |
| 8,187,752 B2 * | 5/2012 | Buckley | H01M 2/1653 | 429/217 |
| 8,541,986 B2 * | 9/2013 | Hiraoka | H01M 10/0525 | 320/162 |
| 8,558,511 B2 * | 10/2013 | Hammerstrom | H02J 7/0072 | 320/137 |
| 8,637,190 B2 * | 1/2014 | Kimura | H01M 10/48 | 429/304 |
| 8,717,186 B2 * | 5/2014 | Zhou | H01M 10/482 | 340/636.11 |
| 8,854,012 B2 * | 10/2014 | Dai | G01R 31/392 | 320/150 |
| 8,889,276 B2 * | 11/2014 | Bernard | H01M 8/04873 | 429/9 |
| 8,896,271 B2 * | 11/2014 | Kim | H01M 10/443 | 320/136 |
| 8,999,576 B2 * | 4/2015 | Ohira | H01M 4/5825 | 429/218.1 |
| 9,012,049 B2 * | 4/2015 | Fetzer | H01M 10/0525 | 429/50 |
| 9,083,062 B2 * | 7/2015 | Kumar | H01M 4/131 | |
| 9,184,615 B2 * | 11/2015 | Kim | H02J 7/0071 | |
| 9,213,070 B2 * | 12/2015 | Hoshino | G01R 31/367 | |
| 9,225,017 B2 * | 12/2015 | Sakitou | H01M 4/32 | |
| 9,252,623 B2 * | 2/2016 | Sim | H01M 10/44 | |
| 9,263,900 B2 * | 2/2016 | Ju | B60L 58/15 | |
| 9,337,489 B2 * | 5/2016 | Ohira | H01M 4/136 | |
| 9,350,022 B2 * | 5/2016 | Ohira | H01M 4/625 | |
| 9,368,995 B2 | 6/2016 | Nishino et al. | | |
| 9,419,280 B2 * | 8/2016 | Ohira | H01M 10/052 | |
| 9,450,443 B2 * | 9/2016 | Dai | H02J 7/0091 | |
| 9,531,203 B2 * | 12/2016 | Honda | H02J 7/0063 | |
| 9,608,299 B2 * | 3/2017 | Adams | H01M 10/48 | |
| 9,660,299 B2 * | 5/2017 | Xu | H01M 10/42 | |
| 9,791,514 B2 * | 10/2017 | Nishizawa | H01M 10/48 | |
| 9,812,742 B2 * | 11/2017 | Yamamoto | H01M 10/446 | |
| 9,853,271 B2 * | 12/2017 | Iwase | H01M 10/0431 | |
| 9,866,052 B2 * | 1/2018 | Honoki | H01M 10/46 | |
| 9,893,542 B2 * | 2/2018 | Hwang | H02J 7/0047 | |
| 9,912,186 B2 * | 3/2018 | Dai | G01R 31/392 | |
| 10,044,073 B2 * | 8/2018 | Jun | H01M 10/4257 | |
| 10,074,996 B2 * | 9/2018 | Stefanopoulou | G01R 31/387 | |
| 10,120,035 B2 * | 11/2018 | Steiber | G01R 31/392 | |
| 10,158,149 B2 * | 12/2018 | Albert | H01M 10/4257 | |
| 10,209,319 B2 * | 2/2019 | Kaiya | H02J 7/00 | |
| 10,279,700 B2 * | 5/2019 | Takebayashi | G01R 31/36 | |
| 10,319,986 B2 * | 6/2019 | Tuduki | H01M 4/505 | |
| 10,338,144 B2 * | 7/2019 | Sugiyama | G01R 31/382 | |
| 10,416,236 B2 * | 9/2019 | Uchino | H01M 10/486 | |
| 10,468,900 B2 * | 11/2019 | Dai | H02J 7/0071 | |
| 10,541,415 B2 * | 1/2020 | Yang | H01M 4/13 | |
| 10,547,184 B2 * | 1/2020 | Carralero | H02J 7/0047 | |
| 10,566,815 B2 * | 2/2020 | Fujita | H02J 7/00041 | |
| 10,587,016 B2 * | 3/2020 | Lee | H01M 10/425 | |
| 10,587,135 B2 * | 3/2020 | Lundgren | G01R 31/389 | |
| 10,594,003 B2 * | 3/2020 | Tashiro | H01M 10/486 | |
| 10,601,026 B2 * | 3/2020 | Song | H01M 4/043 | |
| 2002/0001745 A1 * | 1/2002 | Gartstein | H01M 10/48 | 429/61 |
| 2002/0109126 A1 * | 8/2002 | Kise | H01M 10/4235 | 252/500 |
| 2002/0119364 A1 * | 8/2002 | Bushong | H01M 2/0421 | 429/61 |
| 2002/0146617 A1 * | 10/2002 | Johnson | B64G 1/425 | 429/50 |
| 2004/0251870 A1 * | 12/2004 | Ueda | B60L 53/11 | 320/104 |
| 2005/0029990 A1 * | 2/2005 | Tsukamoto | H01M 10/44 | 320/135 |
| 2005/0137823 A1 * | 6/2005 | Becker-Irvin | H02J 7/0091 | 702/130 |
| 2005/0191542 A1 * | 9/2005 | Bushong | H01M 2/0421 | 429/50 |
| 2006/0076926 A1 * | 4/2006 | Lee | H02J 7/0091 | 320/112 |
| 2006/0132094 A1 * | 6/2006 | Koo | B60L 3/0046 | 320/132 |
| 2007/0075678 A1 * | 4/2007 | Ng | H02J 7/007192 | 320/106 |
| 2008/0090134 A1 * | 4/2008 | Berg | H01M 10/425 | 429/50 |
| 2008/0191666 A1 * | 8/2008 | Kernahan | H01M 10/44 | 320/150 |
| 2008/0191667 A1 * | 8/2008 | Kernahan | H01M 10/44 | 320/150 |
| 2009/0053586 A1 * | 2/2009 | Fredriksson | H01M 2/08 | 429/57 |
| 2009/0079397 A1 * | 3/2009 | Ibrahim | H02J 7/0026 | 320/136 |

(56) References Cited

U.S. PATENT DOCUMENTS

| | | | |
|---|---|---|---|
| 2009/0197184 A1* | 8/2009 | Kawashima | H01M 6/164 429/331 |
| 2009/0322284 A1* | 12/2009 | Tsai | H02J 7/0029 320/136 |
| 2010/0156356 A1 | 6/2010 | Asakura et al. | |
| 2010/0253290 A1* | 10/2010 | Hammerstrom | H02J 7/0072 320/137 |
| 2011/0064980 A1* | 3/2011 | Ohira | H01M 4/134 429/94 |
| 2011/0121787 A1* | 5/2011 | Kim | H01M 10/443 320/134 |
| 2011/0161025 A1* | 6/2011 | Tomura | H01M 10/48 702/63 |
| 2011/0181249 A1* | 7/2011 | Deguchi | H01M 10/0525 320/149 |
| 2011/0267001 A1* | 11/2011 | Hiraoka | H01M 10/0525 320/107 |
| 2012/0070708 A1* | 3/2012 | Ohira | H01M 4/5825 429/94 |
| 2012/0189879 A1* | 7/2012 | Fetzer | H01M 10/0525 429/50 |
| 2013/0049702 A1* | 2/2013 | Dai | H02J 7/0026 320/150 |
| 2013/0106358 A1* | 5/2013 | Allgaier | H02J 7/0068 320/128 |
| 2013/0249494 A1* | 9/2013 | Ju | B60L 3/0092 320/134 |
| 2013/0314050 A1* | 11/2013 | Matsubara | H02J 7/0077 320/134 |
| 2014/0004424 A1* | 1/2014 | Sakitou | H01M 4/32 429/223 |
| 2014/0062387 A1* | 3/2014 | Kim | H02J 7/0071 320/107 |
| 2014/0084873 A1* | 3/2014 | Sim | H02J 7/007 320/134 |
| 2014/0107949 A1* | 4/2014 | Arnold | G01L 5/00 702/42 |
| 2014/0255738 A1* | 9/2014 | Adams | H01M 10/48 429/90 |
| 2014/0368205 A1* | 12/2014 | Svensson | H01M 10/48 324/426 |
| 2014/0375279 A1* | 12/2014 | Nishino | H02J 7/0071 320/160 |
| 2015/0048796 A1* | 2/2015 | Sherstyuk | H01M 10/425 320/129 |
| 2015/0102767 A1* | 4/2015 | Dai | H02J 7/0071 320/107 |
| 2015/0104709 A1* | 4/2015 | Ohira | H01M 10/0585 429/221 |
| 2015/0104710 A1* | 4/2015 | Ohira | H01M 4/131 429/221 |
| 2015/0160300 A1* | 6/2015 | Ishii | G01R 31/3648 702/63 |
| 2015/0160302 A1* | 6/2015 | Xu | H01M 10/42 324/427 |
| 2015/0171429 A1* | 6/2015 | Ohira | H01M 4/625 252/182.1 |
| 2015/0244032 A1* | 8/2015 | Yamamoto | H01M 10/446 29/623.1 |
| 2015/0280290 A1* | 10/2015 | Saha | G01D 5/35316 429/50 |
| 2015/0295431 A1* | 10/2015 | Honda | H02J 7/0013 320/136 |
| 2015/0338468 A1* | 11/2015 | Kaiya | H02J 7/00 324/432 |
| 2016/0028254 A1 | 1/2016 | Honoki et al. | |
| 2016/0064972 A1* | 3/2016 | Stefanopoulou | H02J 7/0021 320/116 |
| 2016/0116548 A1* | 4/2016 | Ghantous | G01B 7/22 702/63 |
| 2016/0149270 A1 | 5/2016 | Albert et al. | |
| 2016/0195590 A1* | 7/2016 | Kosugi | H01M 10/425 340/636.19 |
| 2016/0241058 A1* | 8/2016 | Carralero | H02J 7/0047 |
| 2016/0268644 A1* | 9/2016 | Lee | H01M 10/48 |
| 2016/0301054 A1* | 10/2016 | Iwase | H01M 10/0585 |
| 2016/0322676 A1* | 11/2016 | Jun | H02J 7/0063 |
| 2016/0372943 A1 | 12/2016 | Dai et al. | |
| 2016/0380313 A1* | 12/2016 | Morita | H01M 10/486 429/50 |
| 2017/0047622 A1* | 2/2017 | Tashiro | H01M 10/486 |
| 2017/0077717 A1* | 3/2017 | Lundgren | G01R 31/385 |
| 2017/0146609 A1* | 5/2017 | Uchino | G01R 31/367 |
| 2017/0324080 A1* | 11/2017 | Tuduki | H01M 4/525 |
| 2017/0331157 A1* | 11/2017 | Newman | H01M 10/425 |
| 2018/0006342 A1* | 1/2018 | Lee | H01M 2/345 |
| 2018/0076633 A1 | 3/2018 | Fujita et al. | |
| 2018/0097235 A1* | 4/2018 | Yang | H01M 4/13 |
| 2018/0109129 A1* | 4/2018 | Dai | H02J 7/0091 |
| 2018/0134173 A1* | 5/2018 | Takebayashi | G01R 31/36 |
| 2018/0342727 A1* | 11/2018 | Song | H01M 4/043 |
| 2019/0165586 A1* | 5/2019 | Adachi | H02J 7/0068 |
| 2019/0198938 A1* | 6/2019 | Fujita | H01M 10/425 |
| 2019/0324093 A1* | 10/2019 | Tashiro | H01M 10/425 |
| 2019/0348721 A1* | 11/2019 | Unno | H01M 10/0525 |

FOREIGN PATENT DOCUMENTS

| | | | |
|---|---|---|---|
| JP | 58014473 A * | 1/1983 | H01M 10/44 |
| JP | 59154779 A * | 9/1984 | H01M 10/44 |
| JP | 06133468 A * | 5/1994 | |
| JP | 2003-109672 | 4/2003 | |
| JP | 2006-12761 A | 1/2006 | |
| JP | 2010-80225 | 4/2010 | |
| JP | 2010-518805 | 5/2010 | |
| JP | 5289576 | 6/2013 | |
| JP | 2013-201890 | 10/2013 | |
| JP | 5575441 | 7/2014 | |
| JP | 2015-153696 A | 8/2015 | |
| JP | 2016-34170 A | 3/2016 | |
| JP | 2016-93066 A | 5/2016 | |
| JP | 2016-126943 A | 7/2016 | |
| JP | 2018-46667 | 3/2018 | |
| KR | 10-1152662 | 6/2012 | |
| WO | WO 2008/100970 A2 | 8/2008 | |
| WO | WO 2008/108102 A1 | 9/2008 | |
| WO | WO 2013/046690 A1 | 4/2013 | |
| WO | WO 2014/147973 A1 | 9/2014 | |

* cited by examiner

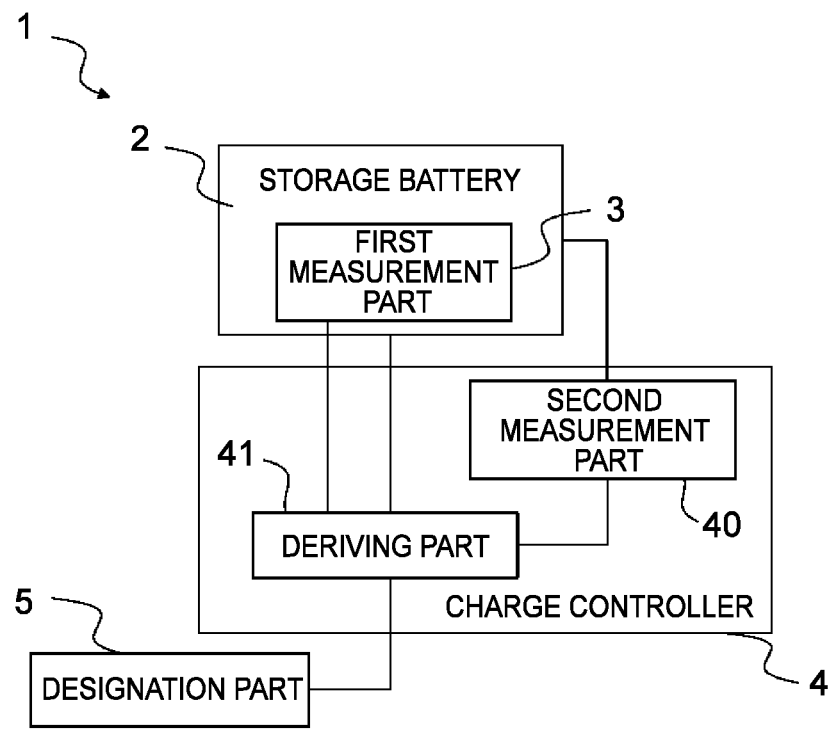
FIG. 1
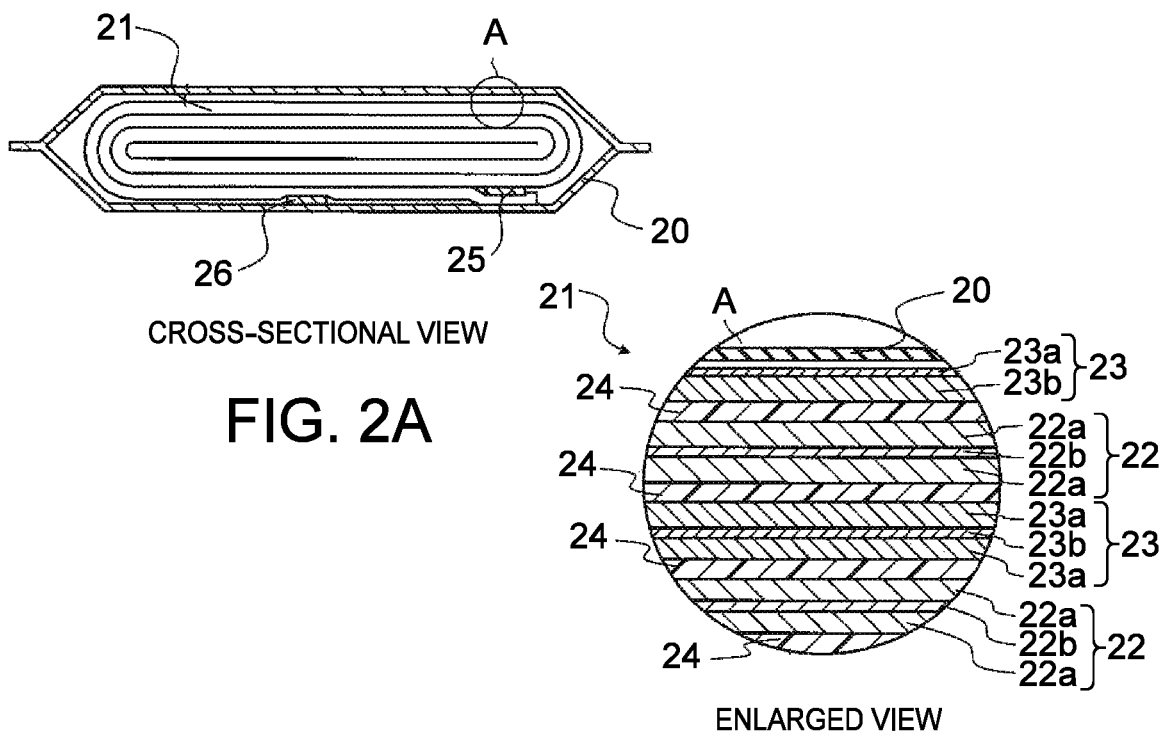
FIG. 2A
FIG. 2B

SECONDARY BATTERY SYSTEM CONTROLLING A SECONDARY BATTERY WITH A VOLUME CHANGE RATE THEREOF, AND A VEHICLE INCLUDING THE SECONDARY BATTERY SYSTEM

CROSS-REFERENCE TO RELATED APPLICATION

This application is based upon and claims the benefit of priority from Japanese Patent Application No. 2017-086462, filed on Apr. 25, 2017; the entire contents of which are incorporated herein by reference.

FIELD

Embodiments described herein relate generally to a secondary battery system, a charging method, and a vehicle.

BACKGROUND

With spread of an information-related device and a communication device, a secondary battery has been widely spread as a power source of a device. The secondary battery is also used in a field of an electric vehicle (EV) and natural energy. In particular, a lithium ion secondary battery has high energy density and can be miniaturized, and therefore is widely used.

In the lithium ion secondary battery, an active material used for a positive electrode and a negative electrode occludes and releases lithium ions to store and release electric energy. During charging, lithium ions released from a positive electrode are occluded by a negative electrode. During discharging, lithium ions released from a negative electrode are occluded by a positive electrode.

In a method for charging a secondary battery, in a case where the battery is charged with a voltage higher than a set voltage, the battery is deteriorated significantly. Therefore, constant current-constant voltage (CC-CV) charging for controlling a current so as to keep a set voltage after charging is performed to a predetermined voltage by a constant current is performed.

In order to shorten charging time, it is conceivable to set a current value of a constant current (constant electric power) to a high value while charging is performed at a constant current (constant electric power). However, a high current value deteriorates storage battery performance of a secondary battery, such as a battery capacity or internal resistance. Furthermore, lifetime of the secondary battery is shortened disadvantageously due to deterioration of the storage battery performance.

BRIEF DESCRIPTION OF THE DRAWINGS

FIG. 1 is a block diagram showing an example of a secondary battery system according to the first embodiment.

FIGS. 2A and 2B are a cross-sectional view showing an example of a unit battery mounted on a storage battery 2 and an enlarged view thereof.

DETAILED DESCRIPTION

Figure 3:
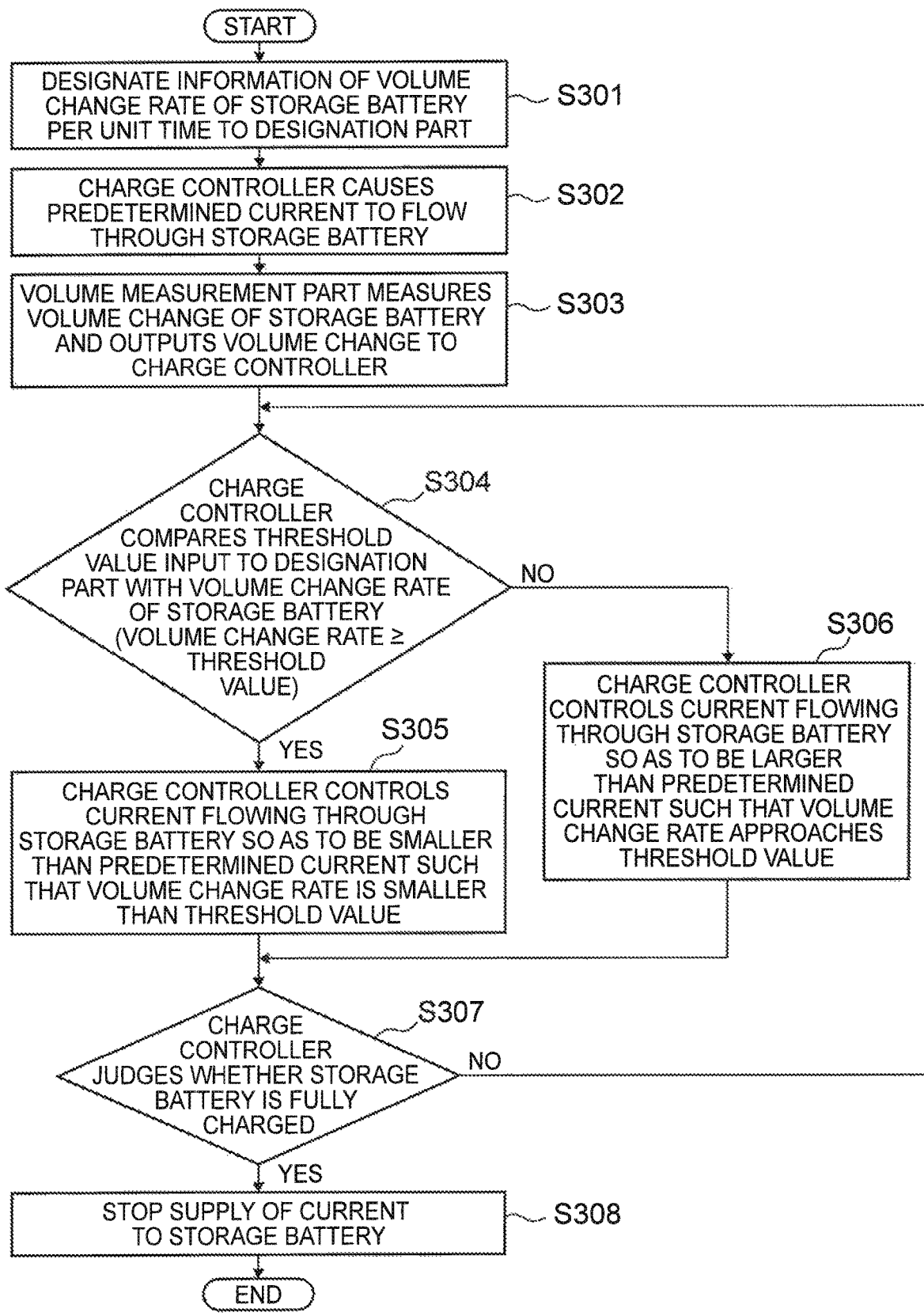
FIG. 3 is a flowchart showing an example of operation of the secondary battery system according to the first embodiment.

According to one embodiment, a secondary battery system includes a secondary battery, a first measurement part, a designation part, and a controller. The first measurement part measures a volume change of the secondary battery. The designation part designates a threshold value. The controller controls a current flowing through the secondary battery, based on the volume change of the secondary battery measured by the first measurement part and the threshold value.

Hereinafter, a secondary battery system, a charging method, and a vehicle according to embodiments will be described with reference to the drawings. Those with the same reference numeral indicate similar items. Note that the drawings are schematic or conceptual, and a relationship between the thickness and the width of each portion, a ratio coefficient of the size between the portions, and the like are not necessarily the same as actual ones. Even in a case of indicating the same portion, the dimensions and ratio coefficients of the portion may be different from each other depending on the drawing.

First Embodiment

The first embodiment will be described with reference to FIG. 1. FIG. 1 is a block diagram showing an example of a secondary battery system according to the first embodiment.

As shown in FIG. 1, a secondary battery system 1 includes a storage battery 2, a volume measurement part 3 (also referred to as a first measurement part), a charge controller 4, and a designation part 5.

In the secondary battery system 1, the volume measurement part 3 measures a volume change of the storage battery 2, and the charge controller 4 controls the amount of a current flowing through the storage battery 2, based on the volume change of the storage battery 2 and a threshold value designated by the designation part 5.

First, the storage battery 2 will be described. The storage battery 2 is a battery charged by the charge controller 4. The storage battery 2 includes one or more battery packs. Each battery pack includes one or more battery modules (also referred to as assembled batteries), and each battery module includes one or more unit batteries (also referred to as cells). The number of battery modules included in each battery pack may be different among the battery packs. In addition, the number of unit batteries included in each battery module may be different among the battery modules. As a unit battery, a chargeable/dischargeable secondary battery is used. For example, the unit battery is preferably a lithium ion secondary battery.

FIGS. 2A and 2B are a cross-sectional view showing an example of a unit battery mounted on the storage battery 2 and an enlarged view thereof. As shown in FIGS. 2A and 2B, a unit battery includes an exterior member and a flat wound electrode group 21 housed in the exterior member 20. The wound electrode group 21 has a structure in which a positive electrode 22 and a negative electrode 23 are spirally wound with a separator 24 interposed therebetween. A nonaqueous electrolyte (not shown) is held by the wound electrode group 21. As shown in FIGS. 2A and 2B, the negative electrode 23 is located on an outermost periphery of the wound electrode group 21. The positive electrode 22 and the negative electrode 23 are alternately laminated via the separator 24 in such a manner that the separator 24, the positive electrode 22, the separator 24, the negative electrode 23, the separator 24, the positive electrode 22, and the separator 24 are located on an inner peripheral side of the negative electrode 23. The negative electrode 23 includes a negative electrode current collector 23a and a negative electrode active material-containing layer 23b supported by the negative electrode current collector 23a. In a portion located on an outermost periphery of the negative electrode 23, the negative electrode active material-containing layer 23b is formed only on one side of the negative electrode current collector 23a. The positive electrode 22 includes a positive electrode current collector 22a and a positive electrode active material-containing layer 22b supported by the positive electrode current collector 22a. As shown in FIGS. 2A and 2B, a belt-like positive electrode terminal 25 is electrically connected to the positive electrode current collector 22a near an outer peripheral end of the wound electrode group 21. Meanwhile, a belt-like negative electrode terminal 26 is electrically connected to the negative electrode current collector 23a near the outer peripheral end of the wound electrode group 21. Tips of the positive electrode terminal 25 and the negative electrode terminal 26 are led out to an outside from the same side of the exterior member 20.

For the exterior member 20 used for a unit battery, a metallic container or a container made of a laminate film is used. As the metallic container, a square or cylindrical metallic can made of aluminum, an aluminum alloy, iron, stainless steel, or the like is used.

The positive electrode 22 used for a unit battery includes the positive electrode current collector 22a and the positive electrode active material-containing layer 22b. The positive electrode active material-containing layer 22b is formed on one side or both sides of the positive electrode current collector 22a, and includes an active material, a conductive agent, and a binder. As the positive electrode active material, for example, an oxide and a composite oxide are used. The oxide includes an oxide represented by either of the following formulas (i) and (ii).

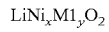  (i)

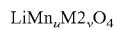  (ii)

M1 is at least one element selected from the group consisting of Mn, Co, Al, Ti, Zr, Cr, V, and Nb. In x+y=1, 0<x≤1.0 and 0≤y≤1.0 are satisfied. M2 is at least one element selected from the group consisting of Al, Mg, Ti, Zr, Cr, V, and Nb. In u+v=2, 0<u≤2.0 and 0≤v<2.0 are satisfied. A conductive agent enhances current collection performance and suppresses contact resistance between an active material and a current collector. Preferable examples of the conductive agent include acetylene black, carbon black, graphite, and a carbon fiber. A binder binds an active material, a conductive agent, and a current collector. Preferable examples of the binder include polytetrafluoroethylene (PTFE), polyvinylidene fluoride (PVdF), and a fluorine-based rubber. The positive electrode current collector 22a is preferably an aluminum foil or an aluminum alloy foil containing one or more elements selected from the group consisting of Mg, Ti, Zn, Mn, Fe, Cu, and Si.

The negative electrode 23 used for a unit battery includes the negative electrode current collector 23a, and the negative electrode active material-containing layer 23b formed on one side or both sides of the negative electrode current collector 23a and containing an active material, a conductive agent, and a binder. Examples of the negative electrode active material include a lithium titanium oxide represented by a general formula $Li_{4/3+x}Ti_{5/3}O_4$ (0≤x), a monoclinic material represented by a general formula $Li_xTiO_2$ (0≤x) (bronze structure B), a titanium oxide having an anatase structure ($TiO_2$ as a structure before charge), and a niobium titanium oxide represented by a general formula $Li_xNb_aTiO_7$ (0≤X, 15≤a≤4). In addition, a lithium titanium oxide (lithium titanium-containing composite oxide) having a ramsdellite structure, such as $Li_{2+x}Ti_3O_7$, $Li_{1+x}Ti_2O_4$, $Li_{1.1+x}T_{1.8}O_4$, $Li_{1.07+x}Ti_{1.86}O_4$, or $Li_xTiO_2$ (0≤x) can also be used. In addition, a lithium titanium oxide or a titanium oxide containing at least one element selected from the group consisting of Nb, Mo, W, P, V, Sn, Cu, Ni and Fe may be used. A lithium titanium oxide represented by $Li_xTiO_2$ or $Li_{4/3+x}Ti_{5/3}O_4$ (0≤x≤2) is preferable. As a negative electrode, a new material containing orthorhombic Na-containing niobium titanium composite oxide particles $Li_2Na_{2-x}Ti_{6-x}Nb_xO_{14}$ (LNT) having a high capacity may be used. Each of these negative electrode active materials may contain graphite. As the negative electrode current collector 23a, an aluminum foil or an aluminum alloy foil is preferable. Preferable examples of the conductive agent include acetylene black, carbon black, coke, a carbon fiber, graphite, metal compound powder, and metal powder. Preferable examples of the binder include polytetrafluoroethylene (PTFE), polyvinylidene fluoride (PVdF), a fluorine-based rubber, a styrene-butadiene rubber, and a core-shell binder.

As the separator 24 used for a unit battery, an olefin-based porous film such as polyethylene (PE) or polypropylene (PP) having a porosity of 50% or more, or a cellulose fiber is preferable. Examples thereof include a nonwoven fabric, a film, and paper having a fiber diameter of 10 μm or less.

Examples of the nonaqueous electrolyte include a liquid nonaqueous electrolyte prepared by dissolving an electrolyte in an organic solvent, a gelatinous nonaqueous electrolyte which is a composite of a liquid electrolyte and a polymer material, and a solid nonaqueous electrolyte which is a composite of a lithium salt electrolyte and a polymer material. In addition, an ambient temperature molten salt (ionic melt) containing lithium ions may be used as the nonaqueous electrolyte. Examples of the polymer material include polyvinylidene fluoride (PVdF), polyacrylonitrile (PAN), and polyethylene oxide (PEO).

A plurality of unit batteries included in a battery pack can be electrically connected in series, in parallel, or in combination of series and parallel. The plurality of unit batteries can be electrically connected to constitute an assembled battery. The battery pack may include a plurality of assembled batteries. Note that the term storage battery includes a battery pack, a battery module (assembled battery), a unit battery, and a secondary battery.

Next, the volume measurement part 3 will be described. The volume measurement part 3 measures a volume change in each unit battery of the storage battery 2. The volume measurement part 3 is disposed on a surface of the exterior member 20 of a unit battery. In the storage battery 2 according to the present embodiment, a current flows during charging, and therefore each unit battery expands or contracts according to a charging state. This is because the volume of an active material changes by occluding and releasing ions when the storage battery 2 performs charge and discharge. The volume change of a unit battery gives a dynamic load to an active material, causes physical breakage (for example, cracking) of the active material, and therefore deteriorates performance of the unit battery. In addition, the volume change of a unit battery is caused by occlusion and release of ions, and therefore a volume change rate increases when a current is large. Meanwhile, in a case where the current is small, the volume change rate is small. The volume measurement part 3 measures a volume change at the time of expansion and contraction of each unit battery. The volume change to be measured may be a volume change rate per unit time or a volume change amount (difference). Furthermore, the volume change also includes a change in the thickness of a unit battery or the like. The number of the unit batteries measured by the volume measurement part 3 is not limited to a plurality, but may be one. For example, a displacement gauge, a strain gauge, a pressure sensor, or the like for measuring the thickness of a unit battery is used as the volume measurement part 3. A displacement in one direction of a unit battery may be measured and converted to a volume change. In a case where a unit battery has a square shape, the volume measurement part 3 preferably performs measurement at a portion having the largest surface area. A volume change measured by the volume measurement part 3 is output to the charge controller 4. Volume change data measured by the volume measurement part 3 does not need to be output to the charge controller 4 all the time, and may be output at predetermined time intervals.

Next, the charge controller 4 will be described. The charge controller 4 controls a current flowing through the storage battery 2, based on a measurement result of the volume measurement part 3 and a threshold value designated by the designation part 5 described later. The charge controller 4 includes a second measurement part 40 and a deriving part 41.

The second measurement part 40 measures information such as the current, voltage, temperature, and the like of the storage battery 2, and outputs the information to the deriving part 41. The second measurement part 40 may be a sensor or the like capable of measuring a current, a voltage, and a temperature.

The deriving part 41 controls a current flowing through the storage battery 2 such that a volume change rate of the storage battery 2 does not exceed a threshold value, based on the volume change rate of the storage battery 2 measured by the volume measurement part 3, the information such as a current, a voltage or a temperature measured by the second measurement part 40, and a threshold value designated by the designation part 5 described later. More specifically, while the charge controller 4 causes a predetermined current to flow through the storage battery 2, in a case where the volume change of the storage battery 2 is equal to or more than a threshold value, the charge controller 4 controls a current flowing through the storage battery 2 so as to be smaller than the predetermined current. In a case where the volume change of the storage battery 2 is equal to or less than the threshold value, the charge controller 4 controls the current flowing through the storage battery 2 so as to be larger than the predetermined current. The predetermined current indicates a current flowing when a storage battery is charged. The predetermined current is arbitrarily set according to empirical rules and characteristics of the storage battery. For example, a constant current during constant current-constant voltage (CC-CV) charging corresponds to the predetermined current. The charge controller 4 causes a predetermined current to flow in an initial charging state of the storage battery 2. In a case where the volume change of the storage battery 2 does not exceed a threshold value, the charge controller 4 controls a current so as to be larger than the predetermined current. In a case where the volume change of the storage battery 2 exceeds the threshold value, the charge controller 4 controls the current so as to be smaller than the predetermined current. Furthermore, the charge controller 4 judges whether a predetermined charge amount has been satisfied by deriving a charge amount, based on a value of a current flowing through the storage battery 2. It is only required to judge whether a predetermined charge amount has been satisfied based on preset conditions. The deriving part 41 includes, for example, a central processing unit (CPU), a memory, and an auxiliary storage, and executes a program or the like. Note that all or a part thereof may be realized by using a hardware such as an application specific integrated circuit (ASIC), a programmable logic device (PLD), or a field programmable gate array (FPGA).

The charge controller 4 may arbitrarily set time for causing a predetermined current to flow through the storage battery 2. Even if a predetermined current flows through the storage battery 2 for a long time, a volume change of the storage battery 2 may be smaller than a threshold value. Therefore, it is only required to control a current such that the current increases after a predetermined current has flowed for a certain time. A case where the second measurement part 40 is included in the charge controller 4 has been described. However, the second measurement part 40 may be configured separately from the charge controller 4 without being limited to this case.

Next, the designation part 5 will be described. The designation part 5 designates a threshold value for a volume change of the storage battery 2. In a case where the charge controller 4 performs control based on a volume change rate of the storage battery 2 per unit time, a threshold value of the volume change rate is input to the designation part 5. The threshold value input to the designation part 5 is arbitrarily set by an operator (user) according to past data and characteristics of the storage battery 2. For example, the threshold value is preferably set to a value equal to or lower than a volume change rate at which the storage battery 2 is significantly deteriorated.

The designation part 5 may designate a threshold value using an external terminal such as a personal computer (PC) or a mobile phone, or may input the threshold value directly by attaching a monitor, a touch panel, or, the like. In a case of designation by an external terminal, data may be transferred using the Internet, Wi-Fi, Bluetooth (registered trademark), or the like.

The threshold value designated by the designation part 5 is output to the charge controller 4. In a case where the threshold value is clearly determined by characteristics of the storage battery 2, there is no need to input a threshold value by the designation part 5, but the charge controller 4 only needs to have information of the threshold value. In this case, the designation part 5 is not an essential component. Alternatively, the charge controller 4 may include the designation part 5. Furthermore, the threshold value input to the designation part 5 is not limited to a fixed value, but may be a variation value according to charging time, for example.

Next, an example of operation of the secondary battery system according to the first embodiment will be described. FIG. 3 is a flowchart showing an example of operation of the secondary battery system according to the first embodiment.

First, information of a volume change rate of the storage battery 2 per unit time is designated to the designation part 5 (step 301). In a case where the charge controller 4 previously has information of the volume change rate of the storage battery 2, this step is omitted.

The charge controller 4 causes a predetermined current to flow through the storage battery 2 (step 302).

The volume measurement part 3 measures a volume change of the storage battery 2 and outputs the volume change to the charge controller 4 (step 303).

The charge controller 4 compares a threshold value input to the designation part 5 with a volume change rate of the storage battery 2 (step 304).

If the volume change rate of the storage battery 2 is equal to or larger than the threshold value (Yes in step 304), the charge controller 4 controls a current flowing through the storage battery 2 so as to be smaller than a predetermined current such that the volume change rate is smaller than the threshold value (step 305).

If the volume change rate of the storage battery 2 is smaller than the threshold value (No in step 304), the charge controller 4 controls the current flowing through the storage battery 2 so as to be larger than the predetermined current such that the volume change rate approaches the threshold value (step 306).

The charge controller 4 judges whether the storage battery 2 is fully charged (100% charge) (step 307).

If the charge controller 4 judges that the storage battery 2 is not fully charged (No in step 307), the process returns to step 303.

If the charge controller 4 judges that the storage battery 2 is fully charged (Yes in step 307), the charge controller 4 stops supply of a current to the storage battery 2 (step 308). Thereafter, the process is terminated.

By using the secondary battery system 1 according to the first embodiment, a current can be controlled according to a volume change of the storage battery 2 during charging. Therefore charging with reduced deterioration of the storage battery 2 can be performed.

Furthermore, the volume measurement part 3 can measure the volume change of the storage battery 2 in a timely manner. Therefore, efficient current control can be performed, and charging time can be shortened.

Furthermore, by using a plurality of identical unit batteries for the storage battery 2, it is possible to estimate a volume change of another unit battery by measuring a volume change of one unit battery. Therefore, a secondary battery system can be realized with a simple configuration.

Second Embodiment

Figure 4:
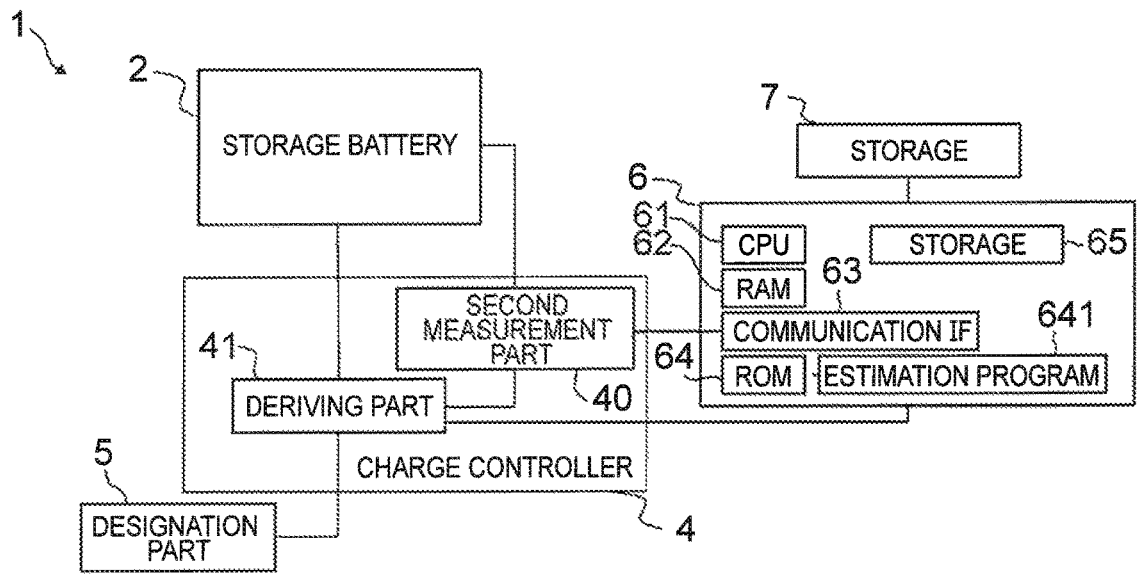
FIG. 4 is a block diagram showing an example of a secondary battery system according to the second embodiment.

The second embodiment will be described with reference to FIG. 4. FIG. 4 is a block diagram showing an example of a secondary battery system according to the second embodiment.

As shown in FIG. 4, a secondary battery system 1 includes a storage battery 2, a charge controller 4, a designation part 5, an estimation part 6, and a storage 7. The secondary battery system according to the second embodiment includes the estimation part 6 and the storage 7 instead of the volume measurement part 3. Other configurations are similar to those of the secondary battery system according to the first embodiment.

In the secondary battery system 1 according to the second embodiment, the estimation part 6 estimates a volume change of the storage battery 2, based on data measured by a second measurement part 40 and data previously stored in the storage 7. The charge controller 4 controls a current flowing through the storage battery 2, based on the volume change of the storage battery 2 estimated by the estimation part 6 and a threshold value designated by the designation part 5.

First, the estimation part 6 will be described in detail. The estimation part 6 includes a CPU 61, a RAM (RWM) 62, a communication IF 63, a ROM 64, and a storage 65. In addition, the estimation part 6 may include an interface (IF) on which an external storage device such as a USB memory is mounted. The estimation part 6 is a computer for executing and computing a program.

The estimation part 6 collects data such as a current or a voltage of the storage battery 2 measured by the second measurement part 40 via the communication IF 63, and performs various deriving processes using the collected data.

The CPU 61 is an arithmetic processing unit (microprocessor) for reading each program previously written in the ROM 64 into the RAM 62 and performing a deriving process. The CPU 61 can be configured by a plurality of CPU groups (microcomputers and microcontrollers) according to a function. In addition, the CPU 61 may include a built-in memory having a RAM function.

The RAM (RWM) 62 is a memory area used when the CPU 61 executes a program, and is a memory used as a working area. The RAM (RWM) 62 preferably temporarily stores data necessary for a process.

The communication IF 63 is a communication device and a communication means for exchanging data with the charge controller 4. For example, the communication IF is a router. In the second embodiment, connection between the communication IF 63 and the storage battery 2 is described as wired communication, but can be replaced with various wireless communication networks. Furthermore, connection between the communication IF 63 and the charge controller 4 may be performed via a network capable of one-way or two-way communication.

The ROM 64 is a program memory for storing an estimation program 641. A non-primary storage medium on which data cannot be written is preferable used. However, a storage medium from which data can be read and on which data can be written at any time, such as a semiconductor memory, may be used. Furthermore, the ROM 64 may store an information registration program or the like for storing acquired data in the storage 65 at predetermined time intervals.

The estimation program 641 is a means for causing the CPU 61 to realize a function of deriving capacity values and internal resistance values of a positive electrode and a negative electrode for each unit battery or each assembled battery constituting the storage battery 2. For example, seven values represented by numerical formula (1), (a) a capacity of an active material A constituting a positive electrode, (b) a capacity of an active material B constituting the positive electrode, (c) a capacity of a negative electrode, (d) a charge amount of the active material A constituting the positive electrode, (e) a charge amount of the active material B constituting the positive electrode, (f) a charge amount of the negative electrode, and (g) an internal resistance value, are derived (analyzed).

$$Q_{cA}、Q_{cB}、Q_a、q_0{}^{cA}、q_0{}^{cB}、q_0{}^a、R \quad (1)$$

By using these values, change characteristics of a charging voltage with respect to time, and potential characteristics of the positive electrode with respect to the charge amount or the negative electrode with respect to the charge amount, are derived. Specific operation will be described later.

The estimation program 641 is configured by a program group corresponding to each of the following numerical formulas. Note that order of the programs can be changed variously.

A charging voltage $V_C$ is determined from the following numerical formula (2) using an electromotive voltage $V_e$ of a battery, and a voltage $V_R$ due to internal resistance.

$$V_C = V_e + V_R \quad (2)$$

The electromotive voltage $V_e$ of a battery is determined from the following numerical formula (3) using a potential $E_c$ of a positive electrode and a potential $E_a$ of a negative electrode.

$$V_e = E_c - E_a \quad (3)$$

The potentials of the positive electrode and the negative electrode are determined from numerical formulas (4) and (5) using a charge amount (q), a capacity $Q_{ic}$ of the positive electrode in an initial state, and a capacity $Q_{ia}$ of the negative electrode in the initial state.

$$E_c = f_c(q/Q_{ic}) \quad (4)$$

$$E_a = f_a(q/Q_{ia}) \quad (5)$$

Here, a case where a positive electrode or a negative electrode is constituted by a plurality of active materials will be described.

Figure 5:
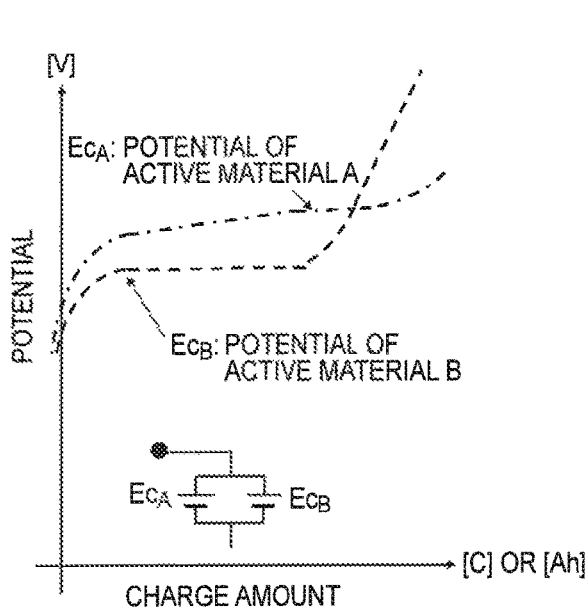
FIG. 5 is a graph showing characteristics in a case where electromotive forces of active materials are different from each other.

FIG. 5 is a graph showing characteristics in a case where electromotive forces of active materials are different from each other.

Characteristics of an electromotive voltage of a composite positive electrode obtained by mixing the active material A (for example, lithium manganate) and the active material B (for example, lithium cobaltite) with respect to a change amount are derived.

Figure 6:
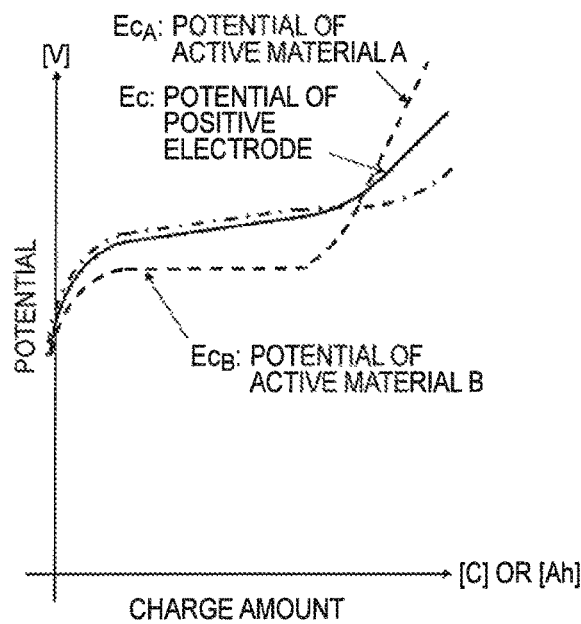
FIG. 6 is a graph obtained by deriving characteristics of an electromotive voltage of a composite positive electrode obtained by mixing an active material A and an active material B with respect to a charge amount.

FIG. 6 is a graph obtained by deriving characteristics of an electromotive voltage of a composite positive electrode obtained by mixing the active material A and the active material B with respect to a charge amount.

A potential $E_{cA}$ of a positive electrode of the active material A and a potential $E_{cB}$ of a positive electrode of the active material B are determined from numerical formulas (6) to (9) using a capacity $Q_{icA}$ of the active material A in an initial state, a capacity $Q_{icB}$ of the active material B in an initial state, a charge amount $q_A$ of the active material A, and a charge amount $q_B$ of the active material B.

$$E_{cA} = f_{cA}(q_A/Q_{icA}) \quad (6)$$

$$E_{cB} = f_{cB}(q_B/Q_{icB}) \quad (7)$$

$$f_{cA}(q_A/Q_{cA}) = f_{cB}(q_B/Q_{cB}) \quad (8)$$

$$q = q_A + q_B \quad (9)$$

Therefore, the potential $E_c$ of a mixed positive electrode is determined from numerical formula (10) using the capacity $q_A$ at the time of starting charging the positive electrode of the active material A and the charge amount $Q_{cA}$ of the positive electrode of the active material A, or the capacity $q_B$ at the time of starting charging the positive electrode of the active material B and the charge amount $Q_{cB}$ of the positive electrode of the active material B.

$$E_c = f_c(q/Q_{ic}) = f_{cA}(q_A/Q_{cA}) = f_{cB}(q_B/Q_{cB}) \quad (10)$$

Note that the potential $E_{cA}$ of the positive electrode of the active material A and the potential $E_{cB}$ of the positive electrode of the active material B are potentials of surfaces of the respective active materials. Therefore, distribution of lithium ions in an active material is changed according to diffusion resistance of lithium ions in the active material. As a result, it seems that a relationship between a charge amount and an electromotive voltage changes according to a charging current. However, in the second embodiment, in an active material used for the positive electrode and a carbon-based active material used for the negative electrode, diffusion resistance is small. Therefore, even if the charging current changes, it is assumed that a relationship between the charging amount and an electromotive voltage does not largely change.

Meanwhile, in a case where a material with large diffusion resistance such as lithium titanate is used as an active material for the negative electrode, as shown in FIG. 5, a relationship between a charge amount and an electromotive voltage largely changes according to a current value. Therefore, approximation similar to that of the positive electrode is not performed.

Accordingly, the negative electrode potential $E_a$ is determined from numerical formula (11).

$$E_a = f_a(q/Q_{ia}, I/Q_{ia}) \quad (11)$$

Furthermore, the voltage $V_R$ due to internal resistance is determined from numerical formulas (12) and (13) using a charging current I and internal resistance R(q).

$$V_R = R(q) \times I \quad (12)$$

$$q = \int I dt \quad (13)$$

That is, numerical formula (2) is determined from numerical formula (14) below.

$$V_c = f_c(q/Q_{ic}) - f_a(q/Q_{ia}, I/Q_{ia}) + R(q) \times I \quad (14)$$

As described above, there is a nonlinear correlation between a charging voltage, and electromotive voltage characteristic and an internal resistance of the active material of the storage battery 2. Using the capacity of an active material and the internal resistance as variables, regression calculation is performed on a characteristic curve with respect to the charge amount of the charging voltage to derive the capacity of the active material, the internal resistance, the capacity at the time of starting charging each active material, and the like.

The estimation part 6 estimates a volume change rate of the storage battery 2, based on the estimated charge amount of the storage battery 2 or the estimated charge amount of an active material used in the storage battery 2, the charge amount of the storage battery 2 or the charge amount of the active material used in the storage battery 2 (stored in a storage described later), and data indicating a volume change rate.

The storage 7 previously stores data indicating a relationship between the charge amount of the storage battery 2 and the volume change rate or a relationship between the charge amount of an active material used in the storage battery 2 and the volume change rate. For example, the data may be stored as table data linking the charge amount to the volume change rate. Stored data is not limited to the volume change rate, but may be data indicating a relationship between the thickness data of the storage battery 2 and the charge amount, and a relationship between the volume change amount of the storage battery 2 and the charge amount. The estimation part 6 estimates the volume change rate of the storage battery 2 using data stored in the storage 7. Examples of the storage 7 include a tape such as a magnetic tape or a cassette tape, a disk including a magnetic disk such as a floppy (registered trademark) disk/hard disk and an optical disk such as CD-ROM/MO/MD/DVD/CD-R, a card such as an IC card (including a memory card)/optical card, and a semiconductor memory such as a mask ROM/EPROM/EEPROM/flash ROM.

Figure 7:
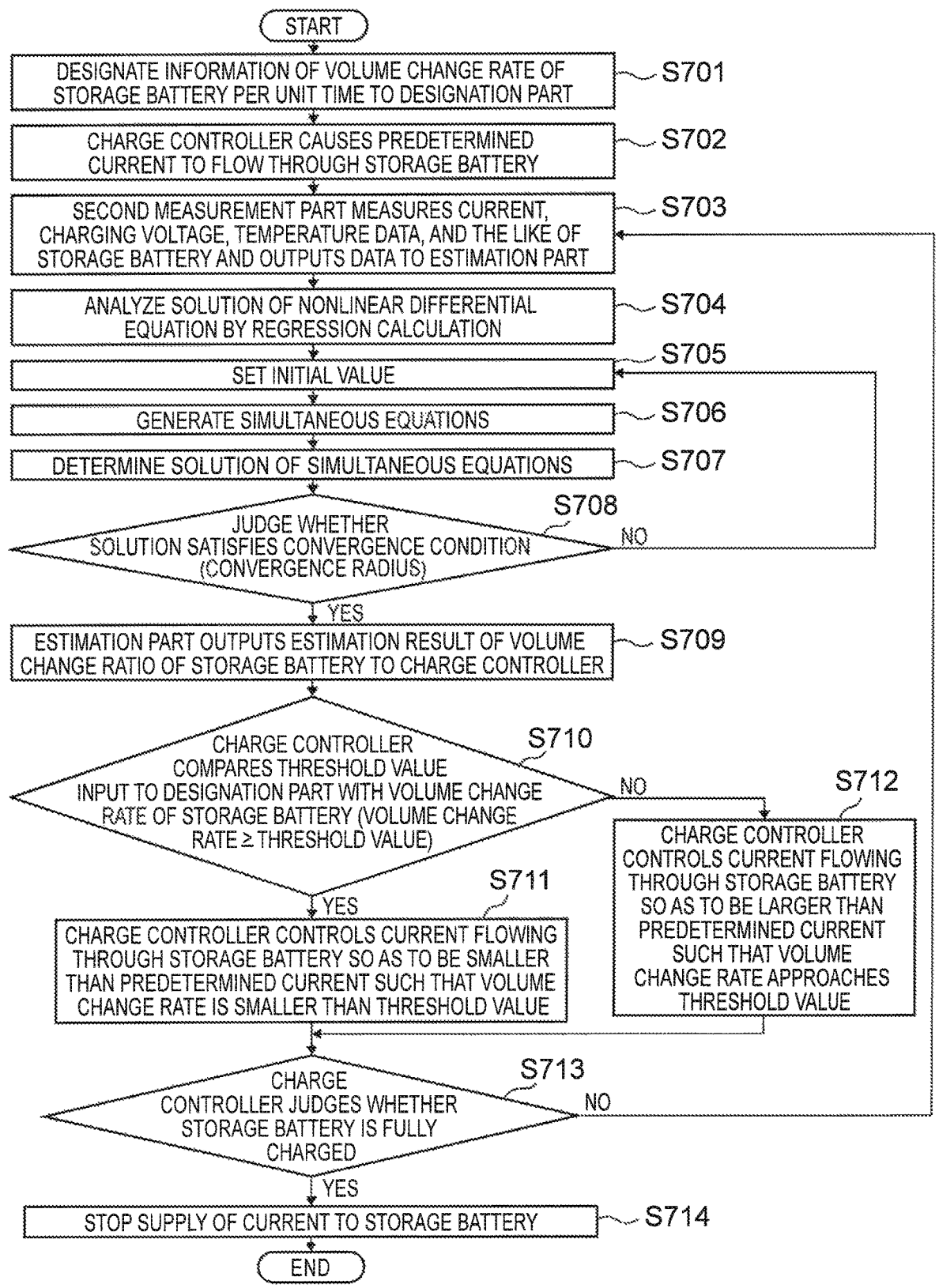
FIG. 7 is a flowchart showing an example of operation of the secondary battery system according to the second embodiment.

Next, an example of operation of the secondary battery system according to the second embodiment will be described. FIG. 7 is a flowchart showing an example of operation of the secondary battery system according to the second embodiment.

First, information of a volume change rate of the storage battery 2 per unit time is designated to the designation part 5 (step 701). As described above, in a case where the charge controller 4 previously has information of the volume change rate of the storage battery 2, this step is omitted.

The charge controller 4 causes a predetermined current to flow through the storage battery 2 (step 702).

The second measurement part 40 of the charge controller 4 measures a current, a charging voltage, temperature data, and the like of the storage battery 2, and outputs the data to the estimation part 6 (step 703). At this time, the second measurement part 40 preferably measures time change of a charging voltage or the like for each unit battery. Measured data such as a charging voltage of each unit battery is stored in the RAM 62 or the storage 7. For example, N measured values are obtained during charging time $t_c$ from start of charging until reaching a charging end voltage.

The CPU 61 of the estimation part 6 executes the estimation program 641 from the ROM 64 and analyzes a solution of a nonlinear differential equation by regression calculation (step 704).

Since constant current charge is performed, q, which is a charge amount from the start of charging is determined by $q_c = I \cdot t$ by numerical formula (13). In this way, measured values $(V_1, q_{c1}), (V_2, q_{c2}), \ldots, (V_N, q_{cN})$ corresponding to the charge amount $q_c$ are obtained. The CPU 61 temporarily stores the obtained value into the RAM 62 or stores the obtained value into the storage 7.

Regression calculation is performed using the above measured values. A residual sum of squares used in performing the regression calculation is represented by the following numerical formula (15).

$$S = \sum_{n=ns+1}^{N} (V_n - (f_c((q_{cn} + q_0^c)/Q_c) - f_a((q_{cn} + q_0^a)/Q_a, 1/Q_a)))^2 \quad (15)$$

$q_0^c$: charge amount of a positive electrode at the time of starting charging $q_0^a$: charge amount of a negative electrode at the time of starting charging The charge amount at the time of starting charging is unknown at the time of the regression calculation. Therefore, the charge amounts of the positive electrode and the negative electrode at the time of starting charging are also unknown. In the second embodiment, in a case where the positive electrode is a composite positive electrode of the active material A and the active material B, the unknown number of the regression calculation is represented by the following formula (16).

$$Q_{cA}, Q_{cB}, Q_a, q_0^{cA}, q_0^{cB}, q_0^a, R \quad (16)$$

As an initial value, an appropriate value, for example, a value at the last measurement is used (step 705).

The simultaneous equations of the following numerical formula (17) are generated (step 706).

$$\begin{cases} \partial S/\partial Q_{cA} = 0 \\ \partial S/\partial Q_{cB} = 0 \\ \partial S/\partial Q_a = 0 \\ \partial S/\partial q_0^{cA} = 0 \\ \partial S/\partial q_0^{cB} = 0 \\ \partial S/\partial q_0^a = 0 \\ \partial S/\partial R = 0 \end{cases} \quad (17)$$

Each value of the next step is determined by the following numerical formula (18) (step 707).

$$\begin{cases} Q_{cA} \leftarrow Q_{cA} + \delta Q_{cA} \\ Q_{cB} \leftarrow Q_{cB} + \delta Q_{cB} \\ Q_a \leftarrow Q_a + \delta Q_a \\ q_0^{cA} \leftarrow q_0^{cA} + \delta q_0^{cA} \\ q_0^{cB} \leftarrow q_0^{cB} + \delta q_0^{cB} \\ q_0^a \leftarrow q_0^a + \delta q_0^a \\ R \leftarrow R + \delta R \end{cases} \quad (18)$$

At this time, numerical formula (19) is represented as follows.

$$\delta Q_{cA}, \delta Q_{cB}, \gamma Q_a, \delta q_0^{cA}, \delta q_0^{cB}, \delta R \quad (19)$$

The numerical formula (19) can be obtained by solving the following numerical formula (20). Description is made using a Newton method in the second embodiment. However, another numerical analysis method such as a Levenberg method or a Marquardt method may be used instead thereof.

$$\begin{pmatrix} \frac{\partial^2 S}{\partial Q_{cA}^2} & \frac{\partial^2 S}{\partial Q_{cA}\partial Q_{cB}} & \frac{\partial^2 S}{\partial Q_{cA}\partial Q_a} & \frac{\partial^2 S}{\partial Q_{cA}\partial q_0^{cA}} & \frac{\partial^2 S}{\partial Q_{cA}\partial q_0^{cB}} & \frac{\partial^2 S}{\partial Q_{cA}\partial q_0^{a}} & \frac{\partial^2 S}{\partial Q_{cA}\partial R} \\ \frac{\partial^2 S}{\partial Q_{cA}\partial Q_{cB}} & \frac{\partial^2 S}{\partial Q_{cB}^2} & \frac{\partial^2 S}{\partial Q_{cB}\partial Q_a} & \frac{\partial^2 S}{\partial Q_{cB}\partial q_0^{cA}} & \frac{\partial^2 S}{\partial Q_{cB}\partial q_0^{cB}} & \frac{\partial^2 S}{\partial Q_{cB}\partial q_0^{a}} & \frac{\partial^2 S}{\partial Q_{cB}\partial R} \\ \frac{\partial^2 S}{\partial Q_{cA}\partial Q_a} & \frac{\partial^2 S}{\partial Q_{cB}\partial Q_a} & \frac{\partial^2 S}{\partial Q_a^2} & \frac{\partial^2 S}{\partial Q_a\partial q_0^{cA}} & \frac{\partial^2 S}{\partial Q_a\partial q_0^{cB}} & \frac{\partial^2 S}{\partial Q_a\partial q_0^{a}} & \frac{\partial^2 S}{\partial Q_a\partial R} \\ \frac{\partial^2 S}{\partial Q_{cA}\partial q_0^{cA}} & \frac{\partial^2 S}{\partial Q_{cB}\partial q_0^{cA}} & \frac{\partial^2 S}{\partial Q_a\partial q_0^{cA}} & \frac{\partial^2 S}{\partial q_0^{cA^2}} & \frac{\partial^2 S}{\partial q_0^{cA}\partial q_0^{cB}} & \frac{\partial^2 S}{\partial q_0^{cA}\partial q_0^{a}} & \frac{\partial^2 S}{\partial q_0^{cA}\partial R} \\ \frac{\partial^2 S}{\partial Q_{cA}\partial q_0^{cB}} & \frac{\partial^2 S}{\partial Q_{cB}\partial q_0^{cB}} & \frac{\partial^2 S}{\partial Q_a\partial q_0^{cB}} & \frac{\partial^2 S}{\partial q_0^{cA}\partial q_0^{cB}} & \frac{\partial^2 S}{\partial q_0^{cB^2}} & \frac{\partial^2 S}{\partial q_0^{cB}\partial q_0^{a}} & \frac{\partial^2 S}{\partial q_0^{cB}\partial R} \\ \frac{\partial^2 S}{\partial Q_{cA}\partial q_0^{a}} & \frac{\partial^2 S}{\partial Q_{cB}\partial q_0^{a}} & \frac{\partial^2 S}{\partial Q_a\partial q_0^{a}} & \frac{\partial^2 S}{\partial q_0^{cA}\partial q_0^{a}} & \frac{\partial^2 S}{\partial q_0^{cB}\partial q_0^{a}} & \frac{\partial^2 S}{\partial q_0^{a^2}} & \frac{\partial^2 S}{\partial q_0^{a}\partial R} \\ \frac{\partial^2 S}{\partial Q_{cA}\partial R} & \frac{\partial^2 S}{\partial Q_{cB}\partial q_0^{a}} & \frac{\partial^2 S}{\partial Q_a\partial R} & \frac{\partial^2 S}{\partial q_0^{cA}\partial R} & \frac{\partial^2 S}{\partial q_0^{cB}\partial R} & \frac{\partial^2 S}{\partial q_0^{a}\partial R} & \frac{\partial^2 S}{\partial R^2} \end{pmatrix} \begin{pmatrix} \delta Q_{cA} \\ \delta Q_{cB} \\ \delta Q_a \\ \delta q_0^{cA} \\ \delta q_0^{cB} \\ \delta q_0^{a} \\ \delta R \end{pmatrix} = \begin{pmatrix} -\frac{\partial S}{\partial Q_{cA}} \\ -\frac{\partial S}{\partial Q_{cB}} \\ -\frac{\partial S}{\partial Q_{ca}} \\ -\frac{\partial S}{\partial q_0^{cA}} \\ -\frac{\partial S}{\partial q_0^{cB}} \\ -\frac{\partial S}{\partial q_0^{a}} \\ -\frac{\partial S}{\partial R} \end{pmatrix} \quad (20)$$

It is judged whether a determined value satisfies a convergence condition (convergence radius) of the following numerical formula (21) (step 708).

$$\begin{cases} \delta Q_{cA} < \varepsilon_{Q_{cA}} \\ \delta Q_{cB} < \varepsilon_{Q_{cB}} \\ \delta Q_a < \varepsilon_{Q_a} \\ \delta q_0^{cA} < \varepsilon_{q_0^{cA}} \\ \delta q_0^{cB} < \varepsilon_{q_0^{cB}} \\ \delta q_0^{a} < \varepsilon_{q_0^{a}} \\ \delta R < \varepsilon_R \end{cases} \quad (21)$$

In a case where the convergence condition is not satisfied (No in step 708), an initial value is reset (step 705).

If the convergence condition is satisfied (Yes in step 708), the estimation part outputs an estimation result of a volume change ratio of the storage battery to the charge controller 4, based on estimated data such as a charging voltage or a charge amount of the storage battery 2, and data of a charge amount and the volume change ratio stored in the storage 7 (step 709). For example, the estimation part 6 executes processes from step 704 to step 708 based on a current, a charging voltage, temperature data and the like of the storage battery measured during last charging, and stores a derived capacity of an active material, an internal resistance, a capacity at the time of starting charging each active material, and the like into the storage or the like. In a case where step 709 is executed based on the stored capacity of the active material, the internal resistance, the capacity at the time of starting charging each active material or the like, the processes from step 704 to step 708 are omitted.

The charge controller 4 compares a threshold value input to the designation part 5 with the estimated volume change rate of the storage battery 2 (step 710).

If the volume change rate of the storage battery 2 is equal to or larger than the threshold value (Yes in step 710), the charge controller 4 controls a current flowing through the storage battery 2 so as to be smaller than a predetermined current such that the volume change rate is smaller than the threshold value (step 711).

If the volume change rate of the storage battery 2 is smaller than the threshold value (No in step 710), the charge controller 4 controls the current flowing through the storage battery 2 so as to be larger than the predetermined current such that the volume change rate approaches the threshold value (step 712).

The charge controller 4 judges whether the storage battery 2 is fully charged (100% charge) (step 713).

If the charge controller 4 judges that the storage battery 2 is not fully charged (No in step 713), the process returns to step 703.

If the charge controller 4 judges that the storage battery 2 is fully charged (Yes in step 713), the charge controller 4 stops supply of the current to the storage battery 2 (step 714). Thereafter, the process is terminated.

The charge controller 4 only needs to judge whether the storage battery 2 is fully charged at any time using an estimated value of the charge amount of the estimation part 6 or the like. Alternatively, the charge controller 4 only needs to determine whether the storage battery 2 is fully charged by monitoring the charge amount at predetermined time intervals.

In the secondary battery system according to the second embodiment, the estimation part 6 is configured separately from the storage 7, but the storage 7 may be included in the estimation part 6. Furthermore, the estimation part 6 and the storage 7 may be included in the charge controller 4.

Use of the secondary battery system according to the second embodiment makes it possible to obtain the same effect as the secondary battery system according to the first embodiment even without including the volume measurement part 3.

In addition, the secondary battery system is space-saving because of including no volume measurement part 3, and can have a simple configuration.

Third Embodiment

Figure 8:
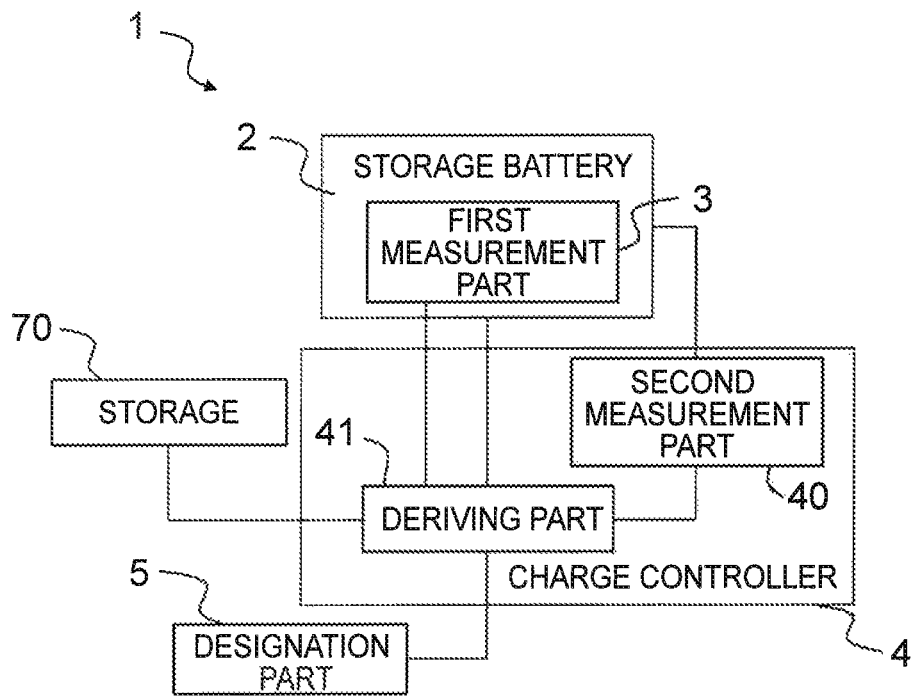
FIG. 8 is a block diagram showing an example of a secondary battery system according to the third embodiment.

The third embodiment will be described with reference to FIG. 8. FIG. 8 is a block diagram showing an example of a secondary battery system according to the third embodiment.

The secondary battery system 1 according to the third embodiment includes a storage 70 storing data indicating a relationship between a charge amount of a storage battery (unit battery) and a thickness of the storage battery. Other configurations are similar to those of the secondary battery system according to the first embodiment.

The storage 70 stores data indicating a relationship between the charge amount and the thickness of a unit battery in a case where a predetermined current flows. The stored data is not limited to the thickness of a storage battery 2 but may be a volume change rate or the like. In addition, the above data is stored for each type of unit battery. Examples of the storage 70 include a tape such as a magnetic tape or a cassette tape, a disk including a magnetic disk such as a floppy (registered trademark) disk/hard disk and an optical disk such as CD-ROM/MO/MD/DVD/CD-R, a card such as an IC card (including a memory card)/optical card, and a semiconductor memory such as a mask ROM/EPROM/EEPROM/flash ROM.

Figure 9:
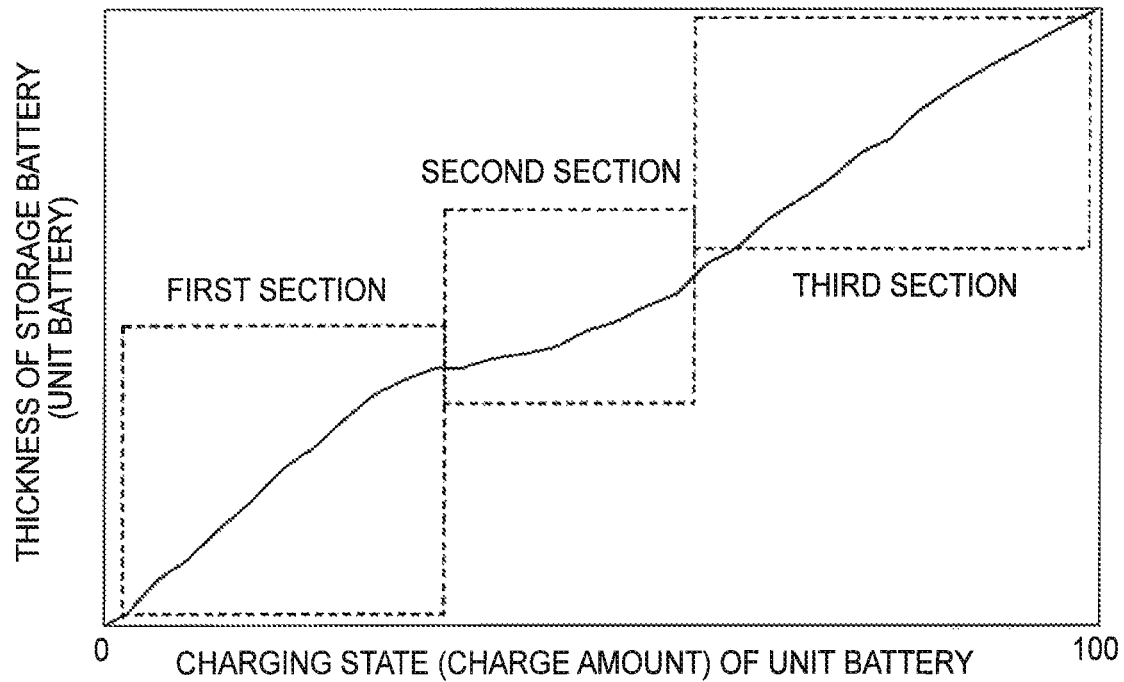
FIG. 9 is a graph showing a relationship between a charge amount and the thickness of a unit battery in a case where graphite is used for a negative electrode of a unit battery.

FIG. 9 is a graph showing a relationship between a charge amount and a thickness of a unit battery in a case where graphite is used for a negative electrode of the unit battery. The horizontal axis indicates the charge amount of the unit battery, and a value thereof is represented by 0 to 100%. The vertical axis indicates the thickness of the unit battery.

As shown in FIG. 9, in a case where graphite is used for the negative electrode of the unit battery, a change in the thickness of the unit battery is classified into three sections of a low charge amount section (also referred to as an initial charging section or a first section), a medium charge amount section (also referred to as a medium charging section or a second section), and a high charge amount section (also referred to as an end charging section or a third section). In the first and third sections, a change rate of the thickness of the unit battery is large. In the second section, the change rate of the thickness of the unit battery is small. A small change rate in thickness means that the volume change rate is small. A large change rate in thickness means that the volume change rate is large. The first to third sections are consecutive sections.

The volume change of a graphite material is caused by a stepwise change in a crystal structure (stage) of graphite according to the occlusion amount of lithium ions. The stages have different volume change rates from one another, and the volume change rate changes as the stage proceeds. Therefore, if the charge amount (current value) per unit time is small in the first and third sections where the volume change rate is large, and if the charge amount (current value) per unit time is large in the second section, deterioration of the unit battery can be reduced without prolonging charging time. Furthermore, it is possible to shorten the charging time while reducing deterioration of the unit battery. A current flowing in the first to third sections may be set at a plurality of constant current values.

The temperature of the unit battery rises when the battery is charged, and progress of deterioration of the battery is advanced when the temperature further rises. Therefore, an average current value flowing in the third section is preferably smaller than an average current value flowing in the first section. The average current value at this time is calculated with respect to the charge amount and does not include a current value in a CV section (constant voltage section). A ratio between an average current value $I_1$ in the first section and an average current value $I_3$ in the third section preferably satisfies $1.0<I_1/I_3<1.6$, and more preferably satisfies $1.25<I_1/I_3<1.45$.

Figure 10:
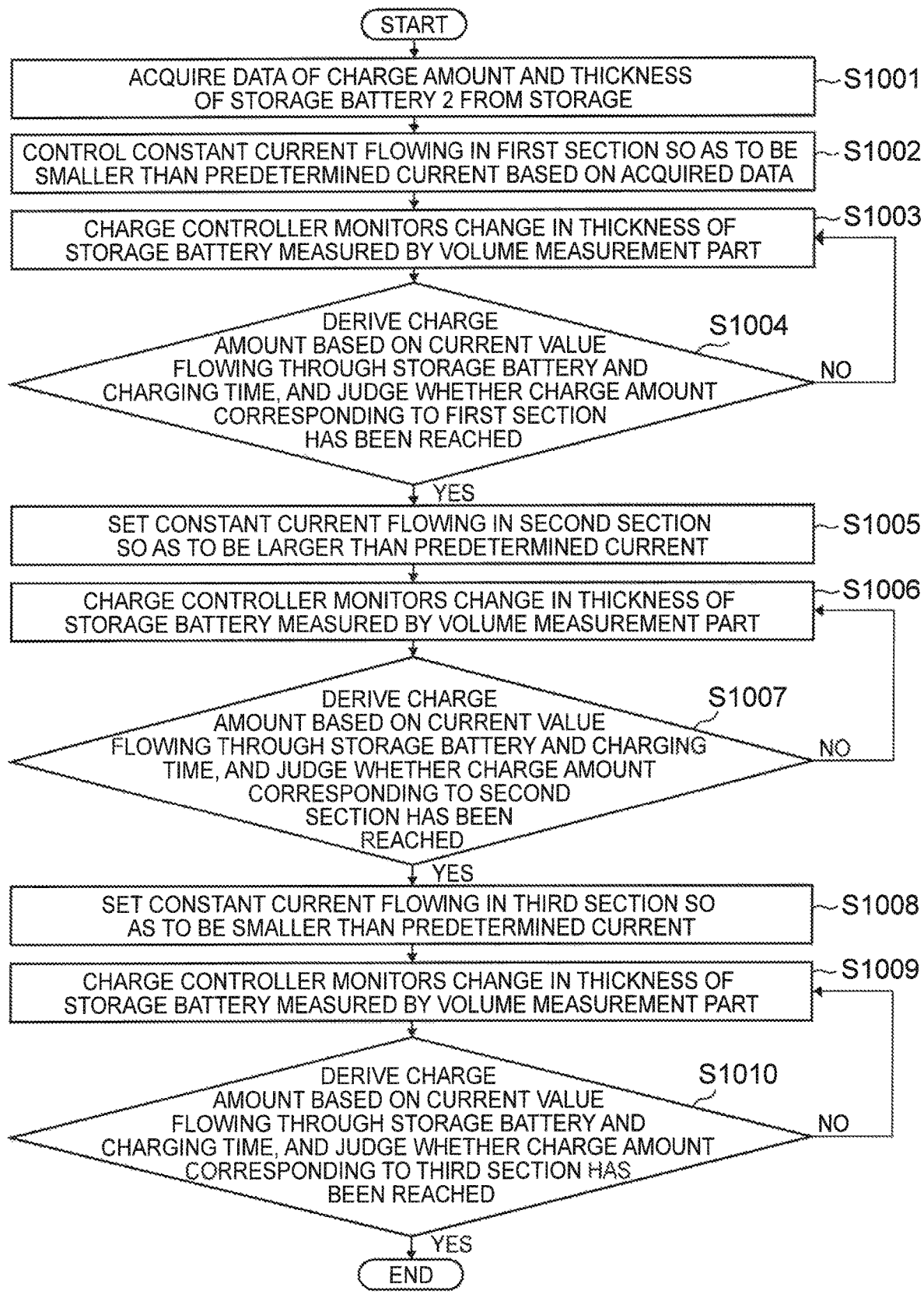
FIG. 10 is a flowchart showing an example of operation of the secondary battery system according to the third embodiment.

Next, an example of operation of the secondary battery system according to the third embodiment will be described. FIG. 10 is a flowchart showing an example of operation of the secondary battery system according to the third embodiment.

First, the charge controller 4 acquires data related to the charge amount and the thickness of the storage battery 2 from the storage 70 (step 1001).

The charge controller 4 controls a constant current flowing in the first section so as to be smaller than a predetermined current based on the acquired data (step 1002).

The charge controller 4 monitors a change in the thickness of the storage battery 2 measured by the volume measurement part 3 (step 1003).

Next, the charge controller 4 derives the charge amount based on a current value flowing through the storage battery and charging time, and judges whether the charge amount corresponding to the first section has been reached (step 1004).

If the charge amount corresponding to the first section has been reached (Yes in step 1004), the constant current flowing in the second section is set so as to be larger than the predetermined current (step 1005).

If the charge amount corresponding to the first section has not been reached (No in step 1004), the process returns to step 1003.

The charge controller 4 monitors a change in the thickness of the storage battery 2 measured by the volume measurement part 3 (step 1006).

Next, the charge controller 4 derives the charge amount based on a current value flowing through the storage battery and charging time, and judges whether the charge amount corresponding to the second section has been reached (step 1007).

If the charge amount corresponding to the second section has been reached (Yes in step 1007), the constant current flowing in the third section is set so as to be smaller than the predetermined current (step 1008). At this time, the constant current flowing in the third section is preferably smaller than the current value which has flowed in the first section.

If the charge amount corresponding to the second section has not been reached (No in step 1007), the process returns to step 1006.

The charge controller 4 monitors a change in the thickness of the storage battery 2 measured by the volume measurement part 3 (step 1009).

Next, the charge controller 4 derives the charge amount based on a current value flowing through the storage battery and charging time, and judges whether the charge amount corresponding to the third section has been reached (step 1010).

If the charge amount corresponding to the third section has been reached (Yes in step 1010), the process is terminated.

If the charge amount corresponding to the third section has not been reached (No in step 1010), the process returns to step 1009.

The magnitude of the current flowing in the first to third sections can be appropriately changed according to charging time. In addition, the current flowing in the first to third sections is not limited to a constant current, but can be appropriately changed according to a measurement result of the storage battery by the volume measurement part 3.

Figure 11:
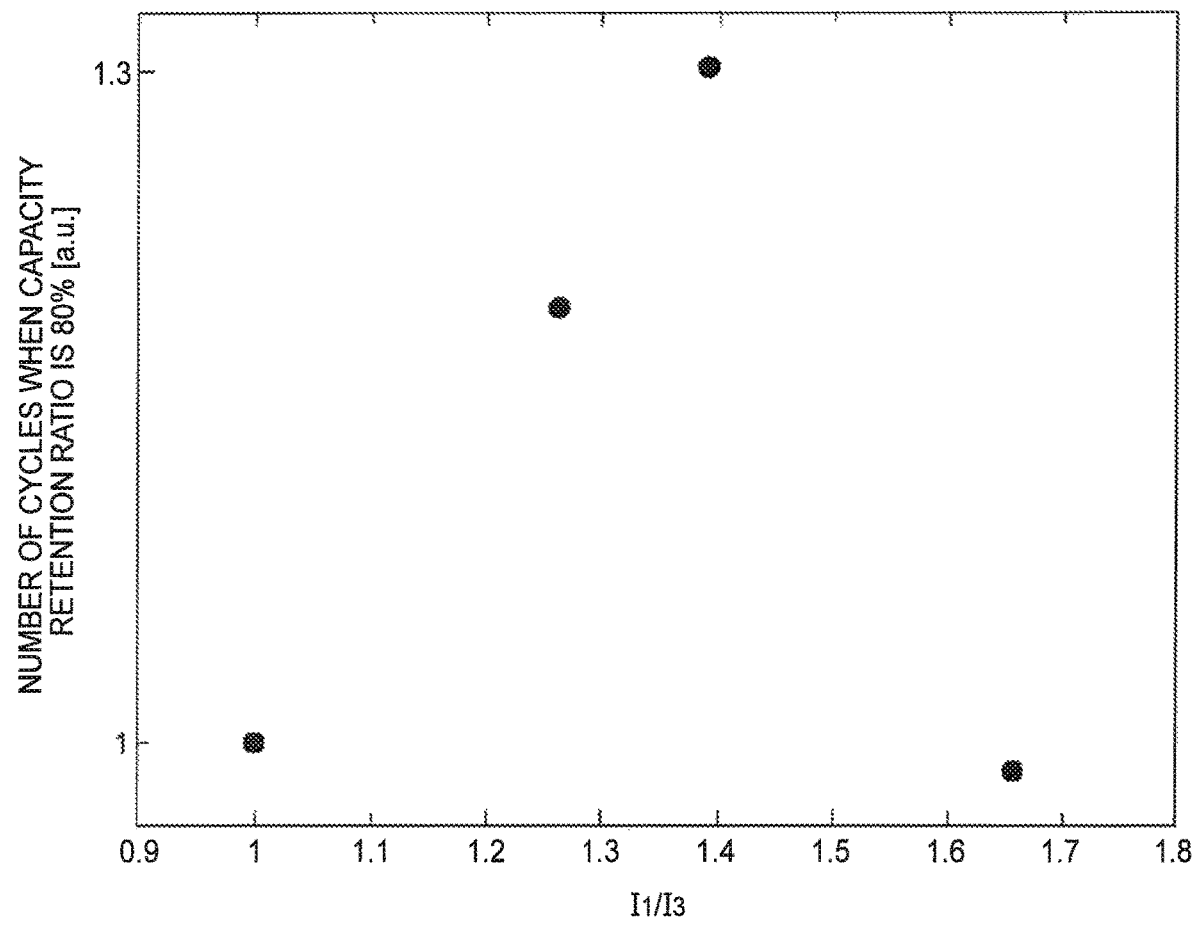
FIG. 11 is a graph showing a result of a cycle test performed by changing a ratio of $I_1/I_3$ in a case where graphite is used for a negative electrode of a storage battery.

FIG. 11 is a graph showing a result of a cycle test performed by changing a ratio of $(I_1/I_3)$ in a case where graphite is used for the negative electrode of the storage battery. The horizontal axis indicates a ratio $(I_1/I_3)$ of an average current in the first and third sections, and the vertical axis indicates the number of cycles when the capacity retention ratio of the storage battery reaches 80%. A case where $(I_1/I_3)$ is 1 indicates conventional CC-CV charging. Using charging time of CC-CV charging as a reference, a current under each condition was set such that the charging time was equal. As shown in FIG. 11, in a case where $(I_1/I_3)$ was 1.4, the cycle number was the largest.

Figure 12:
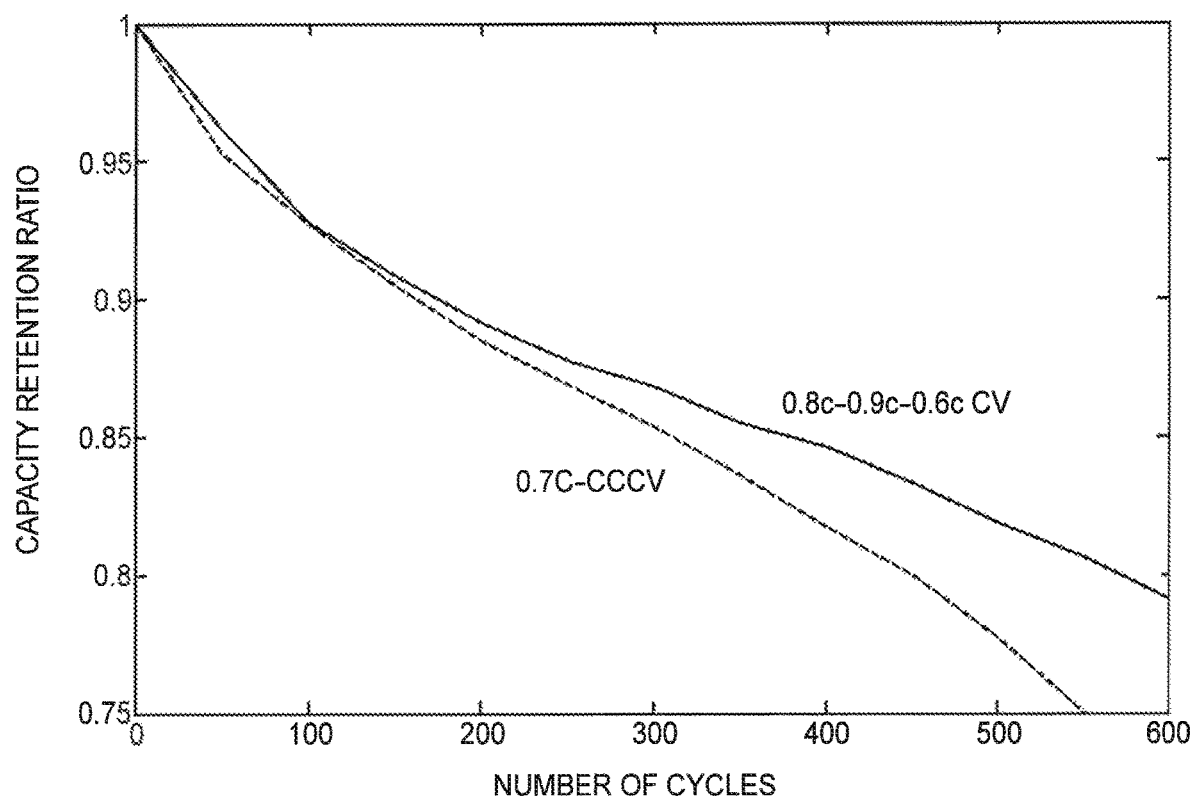
FIG. 12 is a graph showing a relationship between the number of cycles and a capacity retention ratio in a case of 0.7 C-CCCV charging and 0.8 C-0.9 C-0.6 CCV charging.

FIG. 12 is a graph showing a relationship between the number of cycles and a capacity retention ratio in cases of 0.7 C-CCCV charging and 0.8 C-0.9 C-0.6 CCV charging.

As shown in FIG. 12, the capacity retention ratio with respect to the number of cycles is higher in a case of 0.8 C-0.9 C-0.6 CCV charging. That is, when charging is performed, by setting a charging state including at least three sections and setting an average current value in each charging state to (third section<first section<second section), deterioration of the storage battery can be reduced without prolonging charging time.

In the above description, the case of including the first measurement part 3 has been described, but in the third embodiment, the first measurement part 3 can be omitted. With omission of the first measurement part 3, processes in step 1003, step 1006, and step 1009 shown in FIG. 10 can also be omitted.

When a charge amount of a storage battery is derived by setting the charge amount in the first section to 0 to $q_x$, the charge amount in the second section to $q_x$ to $q_y$, the charge amount in the third section to $q_y$ to $q_z$, the charge amount of the storage battery to $q_{cn}$, and the capacity of a negative electrode (graphite) to $Q_a$, the first section is represented by numerical formula (22).

$$\frac{(q_{cn} + q_0^a)}{Q_a} = q_x \qquad (22)$$

The charge amount of the storage battery in the first section is 0 to $(Q_a \times q_x - q_0^a)$ from numerical formula (22). Similarly, the charge amount of the storage battery in the second section is $(Q_a \times q_x - q_0^a)$ to $(Q_a \times q_y - q_0^a)$ The charge amount of the storage battery in the third section is $(Q_a \times q_y - q_0^a)$ to $(Q_a \times q_z - q_0^a)$. The initial charge amount $q_0^a$ and the capacity $Q_a$ of the negative electrode may be values previously stored in the storage, but are preferably updated appropriately according to a charge curve analysis method using the estimation part of the second embodiment or a battery internal state estimation method such as a dVdQ method.

Fourth Embodiment

Figure 13:
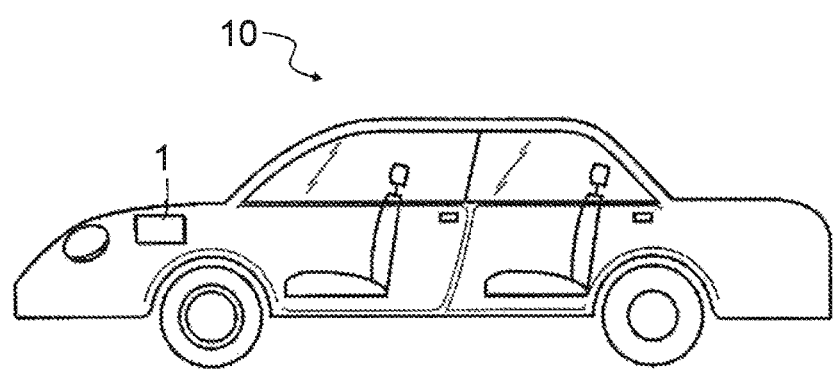
FIG. 13 is a diagram showing an example of a vehicle according to the fourth embodiment.

The fourth embodiment will be described with reference to FIG. 13. FIG. 13 is a diagram showing an example of a vehicle according to the fourth embodiment.

The vehicle of the fourth embodiment includes the secondary battery system according to any one of the first to third embodiments. Examples of the vehicle herein include an automobile including an idling stop mechanism of two wheels to four wheels, a hybrid electric vehicle of two wheels to four wheels, an electric vehicle of two wheels to four wheels, an assist bicycle, and a train.

As shown in FIG. 13, in a vehicle 10 of the fourth embodiment, the secondary battery system 1 according to any one of the first to third embodiments is mounted in an engine room. By disposing the secondary battery system 1 in an engine room of the vehicle in a high temperature environment, a distance from a battery pack to an electric drive system device such as a motor or an inverter is shortened, loss of output and input is reduced, and fuel efficiency is improved.

It is possible to provide the vehicle 10 including the secondary battery system 1 capable of exhibiting excellent cycle characteristics and charging performance because the vehicle 10 includes the secondary battery system 1 according to any one of the first to third embodiments.

The secondary battery system according to any one of the first to third embodiments can be used for electric products, sensors, domestic power storage systems, and the like without being limited to vehicles.

The secondary battery system according to any one of the first to third embodiments is also referred to as a storage battery system, a secondary battery device, or a storage battery device.

In the secondary battery system according to any one of the first to third embodiments, the designation part 5, the estimation part 6, and the storages 7 and 70 may be included in an external server or the like far from the storage battery 2. In this case, the charge controller may include a communication part and may control a charging current (electric power) or the dike of the storage battery 2 by communicating with the external server.

While certain embodiments have been described, these embodiments have been presented by way of examples only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall Within the scope and spirit of the inventions.

What is claimed:

1. A secondary battery system comprising:
   a secondary battery;
   a measurement part that measures a volume change rate of the secondary battery per unit time;
   a designation part that designates a threshold value; and
   a controller that controls a current flowing through the secondary battery, based on the volume change rate per unit time of the secondary battery measured by the measurement part and the threshold value,
   wherein the controller,
      if the volume change rate per unit time is larger than the threshold value, controls the current flowing through the secondary battery so as to be smaller than a predetermined current such that the volume change rate per unit time is reduced below the threshold value, and
      if the volume change rate per unit time is smaller than the threshold value, controls the current flowing through the secondary battery so as to be larger than the predetermined current such that the volume change rate per unit time approaches the threshold value.

2. A vehicle comprising:
   the secondary battery system according to claim 1; and
   an engine room in which the secondary battery system is disposed.

3. A secondary battery system comprising:
   a secondary battery;
   a measurement part that measures at least one of a current, a voltage, and a temperature of the secondary battery;
   an estimation part that
      estimates a charge amount of the secondary battery, based on at least one of the current, the voltage, and the temperature measured by the measurement part, and
      estimates a volume change rate of the secondary battery per unit time, based on the charge amount;

a designation part that designates a threshold value; and
a controller that controls the current flowing through the secondary battery, based on the volume change rate per unit time estimated by the estimation part and the threshold value,
wherein the controller,
  if the volume change rate per unit time is larger than the threshold value, controls the current flowing through the secondary battery so as to be smaller than a predetermined current such that the volume change rate per unit time is reduced below the threshold value, and
  if the volume change rate per unit time is smaller than the threshold value, controls the current flowing through the secondary battery so as to be larger than the predetermined current such that the volume change rate per unit time approaches the threshold value.

4. The secondary battery system according to claim 3, wherein the estimation part further includes a storage that stores a relationship between the charge amount of the secondary battery and the volume change rate per unit time.

5. A vehicle comprising:
the secondary battery system according to claim 3; and
an engine room in which the secondary battery system is disposed.

* * * * *